United States Patent [19]
Liu

[11] Patent Number: 5,166,560
[45] Date of Patent: Nov. 24, 1992

[54] VOLTAGE-CONTROLLED VARIABLE CAPACITOR

[75] Inventor: Ting-Ping Liu, Red Bank, N.J.

[73] Assignee: Bell Communications Research, Inc., Livingston, N.J.

[21] Appl. No.: 739,697

[22] Filed: Aug. 2, 1991

[51] Int. Cl.⁵ .......................... H03G 3/02; H03F 3/45
[52] U.S. Cl. ................................. 307/493; 307/490; 307/491; 307/494; 307/355
[58] Field of Search ........................ 307/490–494, 307/355; 328/127

[56] References Cited

U.S. PATENT DOCUMENTS

| | | | |
|---|---|---|---|
| 3,422,369 | 1/1969 | Campbell | 331/36 |
| 4,147,943 | 4/1979 | Peterson | 307/355 |
| 4,156,283 | 5/1979 | Gilbert | 307/492 |
| 4,303,894 | 12/1981 | Akazawa | 332/16 |
| 4,516,041 | 5/1985 | Quan | 307/262 |
| 4,533,881 | 8/1985 | Monett | 331/36 |
| 4,563,634 | 1/1986 | Lehle | 307/491 |
| 4,575,687 | 3/1986 | Moore, Jr. | 330/261 |
| 4,716,315 | 12/1987 | Bell | 307/491 |
| 4,785,250 | 11/1988 | Lawton | 328/127 |
| 5,021,692 | 6/1991 | Hughes | 307/490 |
| 5,023,489 | 6/1991 | Macbeth | 307/490 |
| 5,081,423 | 1/1992 | Koyama et al. | 328/127 |

*Primary Examiner*—Janice A. Howell
*Assistant Examiner*—Terry D. Cunningham
*Attorney, Agent, or Firm*—Leonard Charles Suchyta; Joseph Giordano

[57] ABSTRACT

An integratable temperature-stable voltage controlled capacitor circuit comprising a variable gain current amplifier connected in parallel and between a reference capacitor and an input-output port. The current amplifier reproduces the current from the reference capacitor, amplifies it, and then adds it in phase to the original current at the input/output port. The equivalent capacitance realized at the input/output port is a linear function of the current amplification and the applied control voltage. The magnitude of the current amplification is determined by a ratio of at least two bias currents applied to the amplifier from two different current sources. Since the gain is dependent on a ratio of bias currents and since temperature affects the bias currents equally when the voltage variable capacitor circuit is integrated on a single chip, this design provides for greater temperature stability.

8 Claims, 2 Drawing Sheets

VOLTAGE-CONTROLLED VARIABLE CAPACITOR

FIELD OF THE INVENTION

This invention relates to voltage variable capacitors and specifically to such capacitors useful for communications systems and instrumentation.

BACKGROUND

Variable capacitors are commonly used for voltage controlled oscillator (VCO) circuits employed in communications systems and instrumentation. Advances in communications systems and instrumentation have created a need for VCOs that can operate at higher frequencies, that are less sensitive to the vagaries of temperature, that can be incorporated into integrated circuits, and that can be easily and more precisely tuned. Such VCOs require temperature stable high bandwidth capacitors whose value of capacitance can be easily predicted and controlled.

One traditional approach for developing voltage-controlled variable capacitors is to employ two-terminal varactor diodes. Varactor diodes are bipolar semiconductor devices fabricated such that there is an inverse relationship between the value of a reverse bias applied across the pn junction and the capacitance of the junction. Varactor diodes have limited application because: their capacitance response to an applied bias voltage varies with temperature; the value of capacitance as a function of the applied voltage is a complicated function; and their doping requirements differ significantly from the semiconductor technology used to fabricate the circuit thereby affecting circuit performance when varactor diodes are integrated onto a single chip with other circuit components. Also, varactor diode devices are traditionally single port devices which suffer from voltage leakage from the control voltage terminal to the output terminal affecting the value of the circuit's equivalent capacitance.

U.S. Pat. No. 4,516,041 (Quan, "Voltage Variable Capacitor") discloses a design for a voltage-controlled variable capacitor that doesn't employ varactor diodes. Quan's patent is for a one-terminal voltage-controlled variable capacitor based on the well-known Miller capacitor in which a voltage amplifier varies the value of the capacitor. While Quan's patented device does generate a capacitance that can be linearly varied with an external control voltage, the device's high input impedance limits its use in high frequency applications. In addition, the device suffers from temperature instability.

Another design approach for making voltage variable capacitors is to employ a switched capacitor network in which the effective capacitance is determined by switching capacitors in and out of the network. The capacitance value can be changed only in a discrete fashion, and such designs are complicated requiring an array of capacitors to implement, consuming large areas on an integrated chip. Therefore, such devices are expensive.

My invention overcomes these drawbacks in the prior art. This invention is a device that produces an equivalent capacitance across two output terminals, that can be linearly varied, that can be used in high-bandwidth applications, that is temperature stable, and that can be integrated in an integrated circuit.

SUMMARY OF THE INVENTION

The voltage-controlled variable capacitor of my invention comprises a variable gain current amplifier connected in parallel with a reference capacitor. The reference capacitor, responsive to a signal received at the circuit's two-terminal input/output port, provides a reference current as input to the current amplifier. The current amplifier reproduces the reference current, amplifies the reproduced current, and adds in phase the amplified reproduced current and the reference current. The control voltage applied to the current amplifier determines the magnitude of the amplified current. The current amplifier's output current is provided to the invention's input/output port. The capacitance across the two terminals at the input/output port is given by $C_{eq}=C_0(1+A_I)$, where $C_0$ is the capacitance value of the reference capacitor and $A_I$ is the current gain.

A pivotal aspect of my invention is the choice of a current amplifier design that responds linearly to a control voltage, that has a small input impedance, and that produces a current gain that is temperature stable. The choice of a current amplifier with a linear response to a control voltage provides for a voltage variable capacitor with a linear response. A small input impedance limits the voltage swings in response to a variable voltage applied to the two-terminal input/output port, which provides the inventive circuit with a high-frequency response. A current amplifier in which the gain is temperature stable results in an equivalent output capacitance that is also temperature stable.

Also, my invention does not use varactor diodes; therefore it can be fabricated as an integrated monolithic device and included in integrated circuit designs.

DETAILED DESCRIPTION

Functional Model

Figure 1:
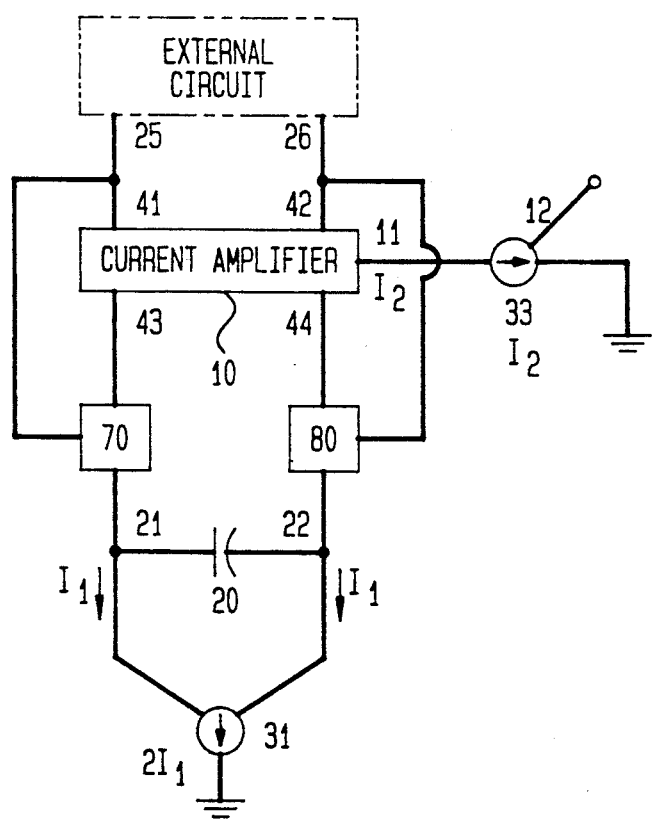
FIG. 1 is a simplified schematic of an illustrative embodiment of my invention.

A general schematic of my variable capacitor is illustrated in FIG. 1. As seen there, the variable capacitor is connected to external circuit elements via two-terminal input/output port 25 and 26. An amplifier 10, with a two-terminal output port 41 and 42, a two-terminal input port 43 and 44 and a control terminal 11, is connected in parallel with a reference capacitor 20. A buffer element 70 is connected between terminal 43 of the current amplifier and electrode 21 of reference capacitor 20. The buffer element 70 is controlled responsive to terminal 25 of the input/output port. A second buffer element 80 is connected between terminal 44 of the current amplifier and electrode 22 of reference capacitor 20 and is controlled responsive to terminal 26 of the input/output port. Electrode 21 of capacitor 20 is also connected to a DC current source 31 which is in turn connected to ground. Similarly, electrode 22 of capacitor 20 is also connected to DC current source 31 which in turn is connected to ground. A current source 33, which is responsive to a control voltage as applied to terminal 12, is connected to the current amplifier 10 via terminal 11.

The operation of the capacitor circuit is described as follows. The voltage-controlled variable capacitor is connected to an external circuit via terminals 25 and 26. A signal received across these terminals is presented across the capacitor 20 via buffer elements 70 and 80. The signal presented across the capacitor induces a reference current to flow along the current path from the current amplifier 10 through terminal 43 across the reference capacitor 20 and through terminal 44 back to the current amplifier 10. This reference current i is added to the DC bias current flowing from buffer 70 to the DC current source 31 and subtracted from the DC bias current flowing from buffer 80 to DC current source. The current amplifier reproduces the reference current i amplifies the reproduced current, adds in phase the amplified reproduced current and the reference current, and induces the resultant current to flow on leads 41 and 42, so that the response of the inventive circuit to the signal provided by external circuit on leads 25 and 26 appears as that of a capacitor with a value that would produce this resultant current flow. The equivalent capacitance that appears across terminals 25 and 26 is given by the expression $C_{eq}=C_0(1+A_I)$, where $C_0$ is the capacitance value of the reference capacitor 20 and $A_I$ is the current gain. The value of the control voltage applied to terminal 12 determines the value of the gain $A_I$.

Two capabilities of the current amplifier are important aspects of my invention. The first is the amplifier's linear gain, and the second is the affect of changes in temperature on the gain. The value of the amplifier gain ($A_I$) can be linearly varied because it is proportional to the ratio of the bias currents $I_1$ (provided by current source 31) and $I_2$ (provided by current source 33). The application of a control voltage applied at terminal 12 linearly changes the value of $I_2$ on control terminal 11, which then linearly changes $A_I$. This capability of linear gain variation is what provides my invention with a linearly variable capacitance. Temperature stability is provided because the circuit design allows for monolithic fabrication. Therefore, as the temperature changes, the electrical properties of the current sources 31 and 33 change equally because they are fabricated from the same material. Furthermore, because the bias currents change equally and the gain is determined by a ratio of the bias currents, the changes are cancelled mitigating the effect of temperature on the gain of the amplifier 10 resulting in an effective capacitance that is temperature stable.

PREFERRED EMBODIMENT

Figure 2:
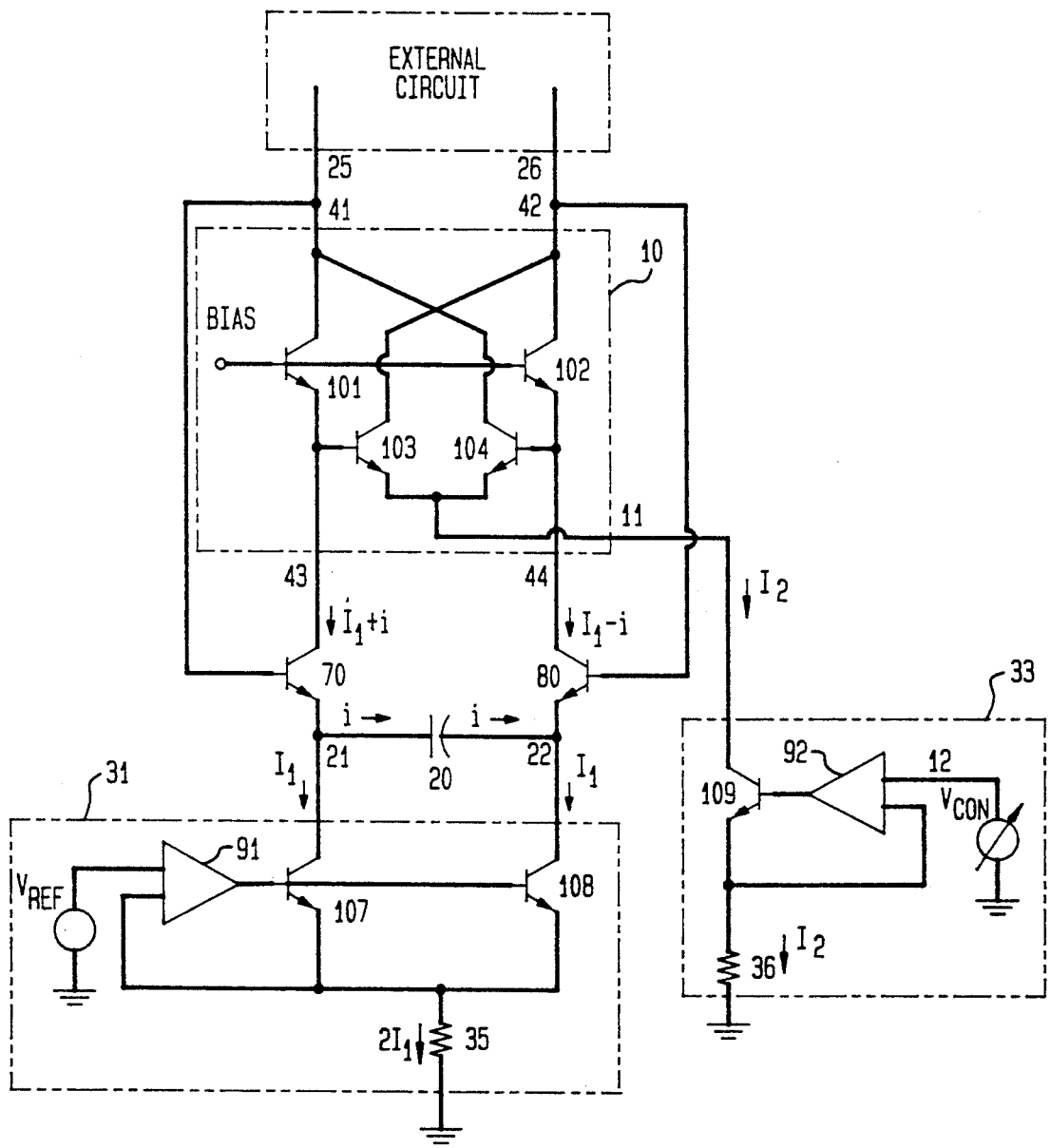
FIG. 2 is a schematic of a specific embodiment of my invention using a Gilbert Gain Cell as the current amplifier.

A detailed schematic of my preferred embodiment using bi-polar technology is illustrated in FIG. 2. For consistency, identical or substantially identical circuit elements are identified by identical numbers in FIG. 1 and FIG. 2. In this preferred embodiment, current amplifier 10 is a Gilbert Gain Cell shown within dotted lines in FIG. 2. The input terminals to the Gilbert Gain Cell are terminals 43 and 44. The output terminals from the Gilbert Gain Cell are terminals 41 and 42, which become the two-terminal 25 and 26 input/output port of my invention. As a signal is received at terminals 41 and 42, the differential input voltage from that signal appears across the reference capacitor 20 via emitter follower transistors 70 and 80. Transistors 70 and 80 are the preferred embodiment of buffers 70 and 80 shown in FIG. 1. The input voltage that appears across the reference capacitor 20 produces current i that is added to the collector-to-emitter current of transistor 70 and subtracted from the collector-to-emitter current of transistor 80. These currents are the input to the Gilbert Gain Cell via terminals 43 and 44.

The Gilbert Gain Cell comprises four transistors 101, 102, 103, and 104. Transistors 101 and 102 are connected to form two parallel current paths from terminals 41 and 42 via terminals 43 and 44 and via transistors 70 and 80 to the reference capacitor 20. Transistor 104 connects the collector of transistor 101 to current source 33 at terminal 11. Transistor 103 connects the collector of transistor 102 also to current source 33 at terminal 11. The base of transistor 104 is connected to the emitter of transistor 102 and the base of transistor 103 is connected to the emitter of transistor 101. Transistors 101 and 102 are biased with current $I_1$ provided by current source 31. Transistors 103 and 104 are biased by current $I_2$ provided by current source 33. The voltages at the emitters of transistors 101 and 102 are applied to the bases of transistors 103 and 104 which reproduce and amplify the current i produced from the reference capacitor. Current i is provided as input to the Gilbert Gain Cell via terminals 43 and 44. The amplified reproduced current is added in phase to current i and output on terminals 41 and 42. The ratio of bias currents $I_1$ and $I_2$ determines the magnitude of the gain produced in the Gilbert Gain Cell. The value of the control voltage applied to terminal 12 of current source 33 controls the value of $I_2$.

Current source 31 comprises transistors 107 and 108, operational amplifier 91, and resistor 35. Current source 31 is connected to the reference capacitor 20 with the collector of transistor 107 connected to electrode 21 and the collector of transistor 108 connected to electrode 22. The emitters of transistors 107 and 108 are connected through resistor 35 to ground and also connected back to the inverting input of operational amplifier 91. The other input terminal to operational amplifier 91 is connected to a reference voltage (Vref). The output terminal of operational amplifier 91 is connected to the base of transistors 107 and 108. This circuit configuration produces nearly identical DC bias currents in the current path from terminal 41 through transistor 70 and in the current path from terminal 42 through transistor 80. However, current source 33 produces a variable DC bias current through transistors 103 and 104 which accounts for the gain of the Gilbert Gain Cell. Current source 33 comprises transistor 109, operational amplifier 92, and resistor 36. The output of operational amplifier 92 controls the current flow through transistor 109. The collector of transistor 109 is connected to the emitters of transistors 103 and 104 within the Gilbert Gain Cell. The emitter of transistor 109 is connected through resistor 36 to ground and the emitter is also fed back into the inverting input port of the operational amplifier 92. As the control voltage applied to operational amplifier 92 is varied, the value of $I_2$ varies.

Since the current gain in the Gilbert Gain Cell $A_I$ is set by the ratio of the bias currents $I_1$ to $I_2$, $A_I$ can be expressed as the ratio of control voltage to reference voltage $$A_I = \frac{I_2}{2I_1} = \frac{V_{con}}{V_{ref}} \frac{R_1}{R_2} \qquad (1)$$

Assuming the components are integrated onto the same chip and match and track each other, then $A_I$ is independent of temperature, supply voltage, and process variations. Thus, my invention produces a temperature stable voltage-controlled linear variable capacitor with an equivalent capacitance of $$C_{eq} = C_0 \left(1 + \frac{V_{con}}{V_{ref}} \frac{R_1}{R_2}\right) \quad (2)$$

where $C_0$ is the value of the reference capacitor. This invention is not dependent on the technology of the reference capacitor; however, in my preferred embodiment an MOS on chip capacitor is used. $V_{ref}$ is derived internally in the preferred embodiment but can be supplied externally. In addition, unlike traditional varactor diode devices, my invention is essentially a two-port network, and therefore achieves superior isolation between the control voltage input and the effective capacitance output.

Clearly, those skilled in the art recognize that the principles that define my circuit structure are not limited to the embodiment illustrated herein. Other embodiments may be readily devised by those skilled in the art.

I claim:

1. A variable capacitor circuit comprising:
   a reference capacitor;
   a two-terminal input/output port;
   a variable gain current amplifier having a two terminal input/port, a two-terminal output port and a control terminal, said output port being connected to said two-terminal input/output port;
   first and second means each responsive to a respective terminal of said input/output port with said first means for connecting one terminal of said reference capacitor to one terminal of said current amplifier's input port, and said second means for connecting the other terminal of said reference capacitor to the other terminal of said input port, wherein by applying a voltage signal across said two-terminal input/output port, said signal is applied across said reference capacitor inducing an AC reference current to flow from said capacitor to said amplifier input port;
   a DC current source means connected between each electrode of said reference capacitor and ground and causing DC currents, equal in value, to flow from one terminal of said amplifier's input port to ground and from the second terminal of said amplifier's input port to ground; and
   current amplifier control means connected to said variable gain current amplifier's control terminal and responsive to a control signal for controlling the amplification of said reference current by said amplifier with the amplified current being applied to said amplifier output port further connected to said input/output port.

2. A variable capacitor circuit in accordance with claim 1 wherein said current amplifier control means comprises
   a DC current source with a variable output.

3. A variable capacitor circuit in accordance with claim 2 wherein said first means for connecting said reference capacitor comprises at least a first transistor connected between one electrode of said reference capacitor and one input terminal of said amplifier and said second means for connecting said reference capacitor comprises at least a second transistor connected between the other electrode of said reference capacitor an the second input terminal of said amplifier.

4. A variable capacitor circuit in accordance with claim 3 wherein said amplifier is a Gilbert Gain Cell.

5. A variable capacitor in accordance with claim 4 wherein said current source means, said amplifier control means and said current amplifier are devices fabricated from the same material and wherein the electrical properties of the devices match and track each other.

6. A variable capacitor circuit comprising:
   a two-terminal input/output port;
   a variable gain current amplifier having a two-terminal input port, a two-terminal output port, and a control terminal, with the two-terminal output port connected to said two-terminal input/output port;
   a reference capacitor;
   means responsive to said input/output port for conecting said reference capacitor across said two-terminal input port and for applying an input voltage received at said two-terminal input/output port across said reference capacitor to produce an AC reference current as input to said current amplifier; and
   a DC current source means connected to each terminal of said reference capacitor and providing the same DC bias currents in each terminal of said amplifier's two-terminal input port, wherein the level of amplification in said amplifier is determined by a ratio of the value of said DC bias current and a current applied to said control terminal, and so that said current amplifier amplifies said AC reference current and then adds in phase said AC refernce current to said amplified AC reference current, with the sum of the reference current and the amplified reference current being provided as the output of the variable capacitor circuit on said amplifier's two-terminal output port.

7. A variable capacitor circuit in accordance with claim 6 wherein said means for applying a voltage signal across said reference capacitor comprises at least a first transistor connected between one electrode of said reference capacitor and one input terminal of said amplifier and a second transistor connected between the other electrode of said reference capacitor and the other input terminal of said amplifier.

8. A variable capacitor circuit in accordance with claim 7 wherein a DC current source is connected to said control terminal and is responsive to a control signal for varying the magnitude of the DC current provided to said control terminal.

* * * * *